United States Patent
Vernenker et al.

(10) Patent No.: US 6,909,663 B1
(45) Date of Patent: Jun. 21, 2005

(54) MULTIPORT MEMORY WITH TWISTED BITLINES

(75) Inventors: Hemanshu T. Vernenker, Austin, TX (US); Allen White, Austin, TX (US); Marge Tait, Austin, TX (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 103 days.

(21) Appl. No.: 10/671,756

(22) Filed: Sep. 26, 2003

(51) Int. Cl.⁷ .............................................. G11C 8/00
(52) U.S. Cl. ...................... 365/230.05; 365/69; 365/154
(58) Field of Search .......................... 365/230.05, 63, 365/69, 154

(56) References Cited

U.S. PATENT DOCUMENTS

| | | | |
|---|---|---|---|
| 4,916,661 A | 4/1990 | Nawaki et al. | 365/190 |
| 5,144,583 A | 9/1992 | Oowaki et al. | 365/206 |
| 5,287,322 A | 2/1994 | Rastegar | 365/230.05 |
| 5,586,072 A * | 12/1996 | Longway et al. | 365/63 |
| 6,084,820 A | 7/2000 | Raszka | 365/230.05 |
| 6,249,452 B1 | 6/2001 | Scott | 365/69 |
| 6,259,621 B1 | 7/2001 | Li et al. | 365/69 |
| 6,370,078 B1 | 4/2002 | Wik et al. | 365/230.05 |
| 6,445,638 B1 * | 9/2002 | Hsu et al. | 365/230.05 |
| 6,480,408 B1 | 11/2002 | Shirley | 365/51 |
| 6,498,758 B1 * | 12/2002 | Pomar et al. | 365/214 |

* cited by examiner

Primary Examiner—Tan T. Nguyen

(57) ABSTRACT

Memory cell arrays are defined by rows and columns of memory cells that are addressed by sets of bitlines associated with a first memory port and a second memory port. The bitlines associated with the first memory port have bitline exchanges associated with a first set of memory cell rows and the bitlines associated with the second memory port have bitline exchanges associated with a second set of memory cell rows. The memory cells can have the same design, and all memory cell columns can have the same design. Read/write logic for the arrays can be based on memory cell row addresses.

17 Claims, 3 Drawing Sheets

To sense amps

MULTIPORT MEMORY WITH TWISTED BITLINES

TECHNICAL FIELD

The disclosure pertains to memory cell arrays.

BACKGROUND

Memory cell arrays are generally configured to store data bits in individually addressable memory cells. The memory cells are arranged in a series of rows and columns, and read/write voltages are applied to individual memory cells using row and column electrodes that are typically referred to as word lines and bit lines, respectively. Memory cell arrays usually have a word line associated with each row of memory cells and pairs of bitlines associated with each memory port. For a single-port memory, a single pair of bitlines is associated with each column, while in multi-port memories additional pairs of bitlines are provided. For example, dual-port memories have two pairs of bitlines associated with each column.

In order to obtain high memory density, memory cells are defined using small circuit areas. As a result, read/write signals propagating on one bitline can be coupled to one or more adjacent bitlines. Such coupling can be associated with inaccurate read/write operations, or can cause data loss in a memory cell. While adjacent bitlines can be shielded using parallel electrodes that are connected to a supply voltage or ground, such electrodes are undesirable in many applications because they use an appreciable amount of available circuit area. Accordingly, improved memories are needed.

SUMMARY

Memory arrays comprise at least a first column of memory cells and a second column of memory cells. The memory cells of the first column and the second column can be of a common design and are associated with at least a first memory port and a second memory port. First column bitlines are in communication with the memory cells of the first column and include bitlines in communication with the first memory port and the second memory port. The bitlines associated with the first memory port include a bitline exchange associated with a first selected row of memory cells and the bitlines associated with the second memory port include a bitline exchange associated with a second selected row of memory cells that is different than the first selected row. Second column bitlines are in communication with the memory cells of the second column and include bitlines in communication with the first memory port and the second memory port. The bitlines associated with the first memory port include a bitline exchange associated with the first selected row of memory cells and the bitlines associated with the second memory port include a bitline exchange associated with the second selected row of memory cells. According to some examples, a conductor is situated between the first column of memory cells and the second column of memory cells and configured to be charged to a predetermined voltage. In other examples, the conductor is configured to supply electrical power to the memory cells of at least one of the first column and the second column of memory cells. In other representative examples, the memory cells of the first column and the second column have a common design. In additional representative examples, the memory cells are associated with a third memory port, and bitlines associated with the third memory port include bitline exchanges at one of the first selected row or the second selected row.

Memories comprise an array of multi-port memory cells arranged in a plurality of rows and columns of memory cells. A plurality of bitlines is in communication with the columns of memory cells. Bitlines for each column of memory cells include pairs of bitlines associated the memory ports of the multi-port memory cells. Bitlines associated with at least a first memory port includes a bitline exchange associated with a first selected row of memory cells and the bitlines associated with at least a second memory port include a bitline exchange associated with a second selected row of memory cells different from the first selected row. In some examples, a set of intercolumn conductors is configured to be charged to at least one fixed voltage. In other examples, the set of intercolumn conductors includes conductors associated with a first voltage and a second voltage. In further representative examples, the bitlines and bitline exchanges associated with a selected memory port are defined in two conductor layers. In other examples, each of the columns of memory cells is of a common design.

Memory drivers for communicating with memory cells in a column of memory cells comprise a multiplexer having a control input and configured to communicate a logical value or a complement of the logical value to or from a selected memory cell in the column of memory cells. A controller is configured to receive a row address of the selected memory cell and direct the multiplexer to select the logical value or the complement of the logical value based on the row address. In representative examples, the controller is configured to provide a control signal to the control input of the multiplexer based on an exclusive OR function of two or more bits of the row address. In other examples, the controller includes an XOR gate.

Multi-port memories comprise a plurality of columns of memory cells, and each of the columns comprise a plurality of rows of memory cells and bitcell exchanges for at least two memory ports. The bitline exchanges for at least one memory port are associated with a first selected row and the bitline exchanges associated with the second memory port are associated with a second row that is different than the first. In representative examples, a conductor is situated between each of the columns of memory cells.

Methods of producing a multi-port memory array comprise defining a column of memory cells having bitlines associated with each of the memory ports. Bitline exchanges are associated with the bitlines of at least two memory ports, wherein the bitline exchanges for the at least two memory ports are associated with different rows. The memory array is defined as a plurality of such columns of memory cells. In some examples, the bitlines and bitline exchanges are defined in two conductor layers. Such methods can be implemented in computer executable instructions stored on a computer readable medium such as a hard disk, CD ROM, floppy disk, RAM, or other memory. Instructions can be provided from a personal computer, workstation, from a server, or over a network.

Methods of reducing electrical interference in a multi-port memory comprise interchanging complementary bitlines associated with a first memory port at at least a first row in substantially all columns of the memory. Complementary bitlines associated with a second memory port at at least a second row are exchanged in substantially all columns of the memory, wherein the second row is different than the first row. In additional examples, the complementary bitlines associated with the first memory port are interchanged at a first set of rows and the complementary bitlines associated with the second memory port are interchanged at a second set or rows, wherein the first set of rows and the second set of rows are different.

These and other features and advantages are set forth below with reference to the accompanying drawings.

DETAILED DESCRIPTION

For convenience, memories that include a plurality of memory cells or bitcells are described with reference to bitlines that are configured to apply electrical signals to the bitcells to store or "write" logical values to the bitcells. These logical values typically correspond to predetermined voltages that are assigned to logical values. Obtaining stored logical values (i.e., "reading" the bitcells) can be performed using the same bitlines. In some examples, only reading to or writing from a bitcell is described, but both read and write operations can be performed. In addition, examples that include relatively small numbers of bitcells are described, but arrays of large numbers of bitcells can be similarly configured. A pair of bitlines is generally provided for each memory port and is configured to communicate a logical value and a complement of the logical value to a memory cell. For convenience, a bitline configured to communicate a complementary value is referred to herein as a complementary bitline. Examples are described with reference to static random access memory (SRAM), but in other examples, dynamic access random access memory (DRAM), or other types of memory arrays can be similarly configured.

Figures 1A, 1B, 2:
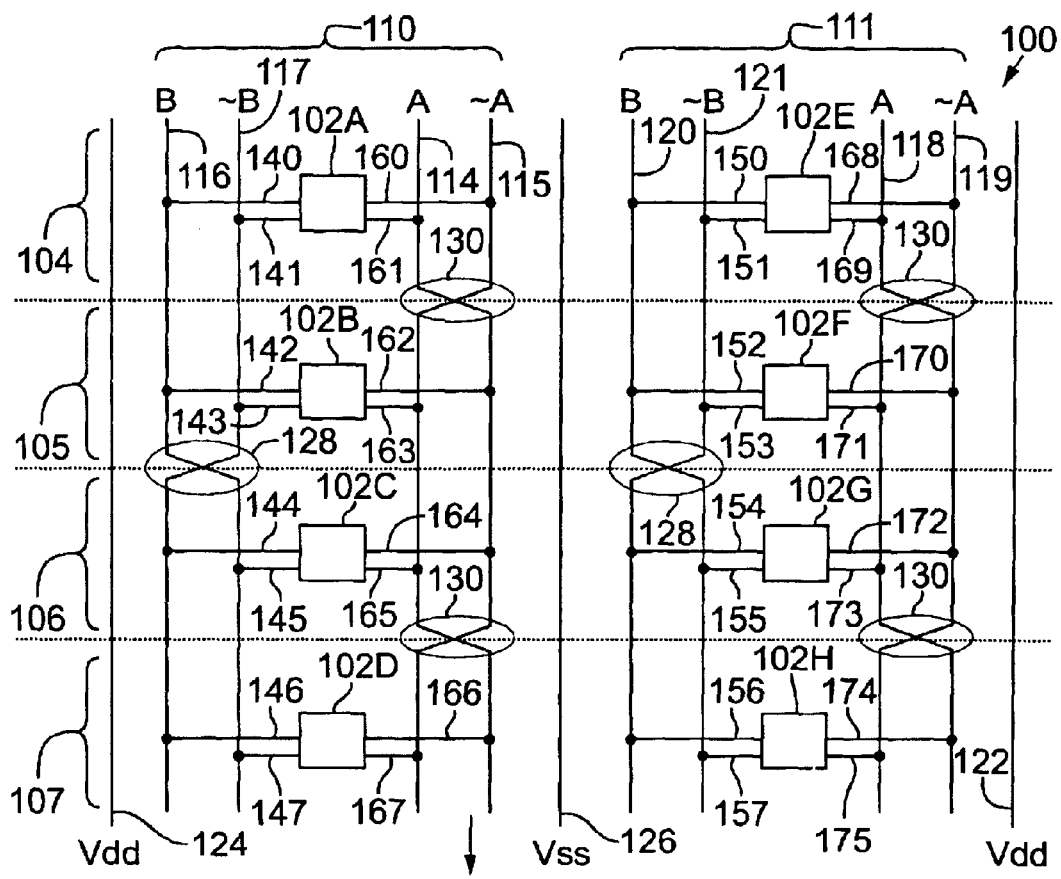
FIG. 1A is a schematic diagram of a portion of a dual port SRAM.
FIG. 1B is a schematic diagram of a representative 8-transisitor bitcell that can be arranged as shown in FIG. 1A.
FIG. 2 illustrates a bitline driver.

With reference to FIG. 1A, a dual port SRAM array 100 includes memory cells (bitcells) 102A–102H arranged in rows 104–107 and columns 110–111. FIG. 1B illustrates a representative 8-transistor memory cell. Typically an SRAM array includes additional rows and columns of memory cells, but for convenience only representative rows and columns are shown in FIG. 1A Bitcell column 110 is associated with A and A-complement (~A) bitlines 114, 115, respectively, associated with memory port A, and B and B-complement (~B) bitlines 116, 117, respectively, associated with memory port B. Bitcell column 111 is associated with A- and ~A-bitlines 118, 119, respectively, and B and ~B-bitlines 120, 121, respectively. The bitcell rows 104–107 are electrically addressable with wordlines that are not shown in FIG. 1A. Conductor lines 122, 124 are situated to be charged to a predetermined voltage Vdd and a conductor line 126 is situated between the bitcell columns 110, 111 and is configured to be charged to a predetermined voltage Vss.

The B-bitlines 116, 120 and the ~B-bitlines 117, 121 crossover in exchange regions 128 that are situated between the rows 105, 106. The A-bitlines 114, 119 and ~A bitlines 115 and 120 of the columns 110, 111 crossover in exchange regions 130.

Bitline crossovers are illustrated in FIG. 1A in association with exchange regions that are situated between bitcell rows, but crossovers can be situated at or within a bitcell, or at other locations in a memory array. In SRAM or other memory arrays that include additional rows and columns of memory cells, bitlines associated with a selected memory port can be configured to exchange at similar or different locations in each bitcell column. Exchanging bitlines that are configured to communicate a logical signal and its logical complement to or from a bitcell reduces or balances electrical signals associated with noise, crosstalk, or other extraneous electrical signals. The application of fixed voltages to the conductors 120, 122, 124 tends to reduce coupling of electrical signals between memory cell columns.

The bitcells 102A–102D are electrically connected to the B-bitline 116 and to the ~B-bitline 117 at B-inputs 140, 142, 144, 146 and ~B-inputs 141, 143, 145, 147, respectively. The bitcells 102E–102H are electrically connected to the B-bitline 116 and to the ~B-bitline 117 at B-inputs 150, 152, 154, 156 and ~B-inputs 151, 153, 155, 157, respectively.

Bitline exchanges can be configured using two or more conductor layers in the memory. For example, A- and ~A-bitlines can be defined in a first conductor layer, and bitline exchanges accomplished by routing one of the bitlines to a second conductor layer situated either over or under the conductor layer in which the A-bitline or the ~A-bitline is defined. After such routing, the bitline that is routed to the second layer can be rerouted to the first layer. Alternatively, the A-bitline and the ~A-bitline can be defined in separate conductor layers, so that bitline exchanges do not require routing a bitline from one conductor layer to another.

While exchanging a bitline and its complement once or periodically in a bitcell column can reduce the effects of undesirable electrical signal couplings, such exchange can also invert logical signal levels applied to the bitcells. For example, a logic level and its complement applied to the B- and ~B-bitlines 116, 117 are communicated to B and ~B-inputs 140, 141, respectively of the bitcell 102A and the ~B- and B-inputs, respectively, of the bitcell 102C. Because of the bitline exchange between the rows 105, 106, logic levels applied to the B- and ~B-bitlines are communicated to B and ~B-inputs of bitcells in these rows, but to the ~B- and B-inputs of the bitcells in the rows 106, 107. Memory port A exhibits a similar exchange of input values. For example, logic levels applied to the A-bitline 114 and the ~A-bitline 115 are communicated to the A and ~A-inputs, respectively, of the bitcells in the rows 104, 107 and to the ~A- and A-inputs, respectively, of bitcells in the rows 105, 106.

The interchange of logic levels associated with bitline crossovers or exchanges can be accommodated in a bitline driver. A representative bitline driver for a 2 bit, 4 row memory (a 2:4 memory) such as the example of FIG. 1A is illustrated in FIG. 2. With reference to FIG. 2, a bitline driver 200 for the A memory port includes a 2-input mux 202, an inverter 204, an exclusive OR (XOR) gate 206, and an input 207. The mux 202 has data inputs 210, 212, a control input 214, and an output 216. A-port memory data such as data associated with the A-inputs of the bitcells is applied to the input 207 and values corresponding to an input A and a logical complement ~A are delivered to the data input 210, 212 of the mux 202.

Control signals delivered to the mux 202 are selected to communicate an appropriate logical value (i.e., either A or ~A) to a bitline based on bitline exchanges to be accommodated. As shown in FIG. 2, row address values RA0, RA1 are supplied to the XOR gate 206 to produce a control signal for the mux 202. Selection of the row address values RA0, RA1 can be based on memory cell row location. A row address of a memory cell can be written as (RA1, RA0), wherein RA1 is a most significant bit and RA0 is a least significant bit of the row address. As shown in FIG. 1A, bitlines are exchanged between the first and second rows (the rows 104, 105) and exchanged again between the third and fourth rows (the rows 106,107). Therefore, logical values applied to the bitlines 116, 117 for the rows 104, 107 are inverted with respect to the logical values for the rows 105, 106. The memory driver 200 is configured so that logical values for bitcells in the middle rows 105, 106 are inverted with respect to the logical values for bitcells in the beginning and ending rows 104, 107. A logical function RA1 XOR RA0 can be used to determine an appropriate control signal for the mux 202. Values of RA1 XOR RA0 are listed in Table 1.

TABLE 1

Values of the logical function A1 XOR A0.

| Row No. | RA1 | RA0 | RA1 XOR RA0 |
|---------|-----|-----|-------------|
| 0 | 0 | 0 | 0 |
| 1 | 0 | 1 | 1 |
| 2 | 1 | 0 | 1 |
| 3 | 1 | 1 | 0 |

Application of the control signal RA1 XOR RA0 for the first and last rows (RA1 XOR RA0=0) causes the logical value applied to the mux input 210(A) to appear at the mux output 216. For the middle two rows, RA1 XOR RA0=1, and an inverted logical value (~A) applied to the input 212 appears at the output 216. A similar configuration can be used for both the A- and ~A-bitlines, and the control signal for driving either the A-bitline or the ~A-bitline can be based on the RA1 XOR RA0 function.

B-memory port bitlines are also exchanged, and a bitline driver similar to the bitline driver 200 can be used to drive B-port bitlines. Because B- and ~B-bitlines are exchanged between the rows 105, 106, a most significant bit RB1 of a row address can be used as a control input to the mux 202, and the XOR gate 206 can be omitted.

Larger memory arrays can include bitline exchanges and bitline drivers can be configured in association with the exchanges. For a representative 3-bit, 8-row memory (a 3:8 memory), an XOR gate can be used to provide drive values to A-port bitlines. A row location can be expressed as (RA2, RA1, RA0), wherein RA2 is a most significant bit of the row address and RA0 is a least significant bit of the row address. Table 2 contains the values of the function RA2 XOR AR1.

TABLE 2

Address logic for memory port A of a 3:8 memory array.

| Row | RA2 | RA1 | RA0 | RA2 XOR RA1 |
|-----|-----|-----|-----|-------------|
| 0 | 0 | 0 | 0 | 0 |
| 1 | 0 | 0 | 1 | 0 |
| 2 | 0 | 1 | 0 | 1 |
| 3 | 0 | 1 | 1 | 1 |
| 4 | 1 | 0 | 0 | 1 |
| 5 | 1 | 0 | 1 | 1 |
| 6 | 1 | 1 | 0 | 0 |
| 7 | 1 | 1 | 1 | 0 |

Addressing of the A-port bitlines of the middle rows (rows 2, 3, 4, 5) is inverted with respect to the rows 0–1 and rows 6–7, and the function RA2 XOR RA1 can be used as to control the mux 202. The B-memory port bitlines are exchanged between rows 3 and 4, and a most significant row address bit RB2 can be used to control the mux 202, and the XOR gate 206 can be omitted.

Figure 3A:
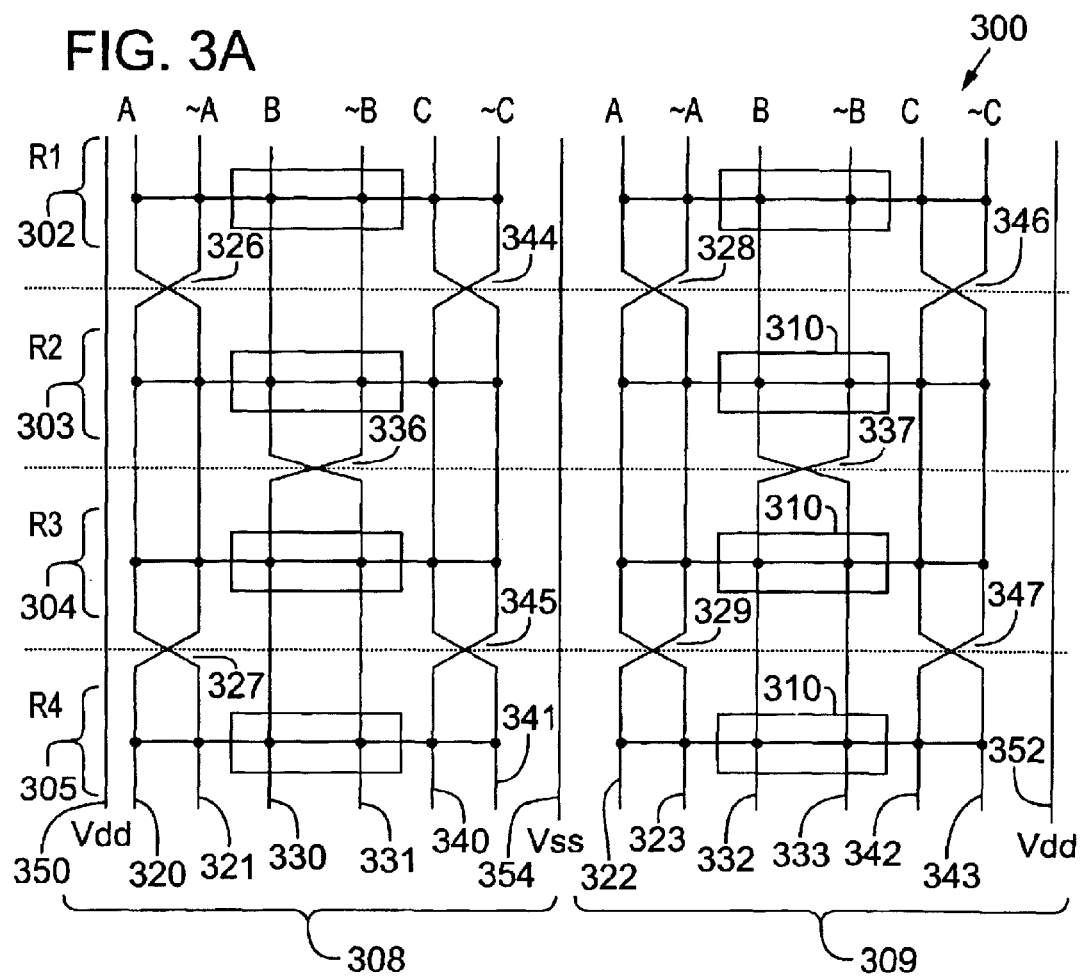
FIG. 3A is a schematic diagram of a portion of a 3-port memory.

A representative 3-port memory 300 is illustrated in FIG. 3A and includes rows 302–305 and columns 308–309 of memory cells 310. A- and ~A-bitlines 320, 321 and 322, 323 for the columns 308, 309, respectively include bitline exchanges 326–329. B- and ~B-bitlines 330–333 include bitline exchanges 336, 337, and C- and ~C-bitlines 340–343 include bitline exchanges 344–347. Conductors 350, 352 are configured to be at a potential Vdd and a conductor 354 is configured to be charged to a potential Vss.

Figure 3B:
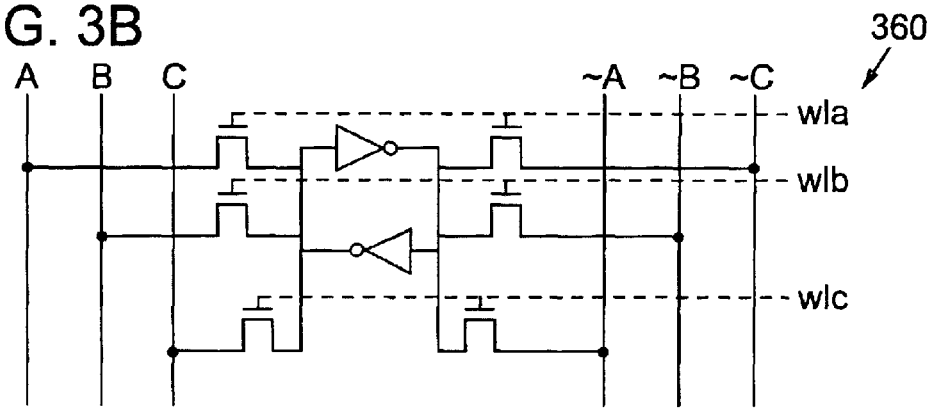
FIG. 3B is a schematic diagram or a representative 3-port memory cell that includes eight transistors.
Figure 3C:
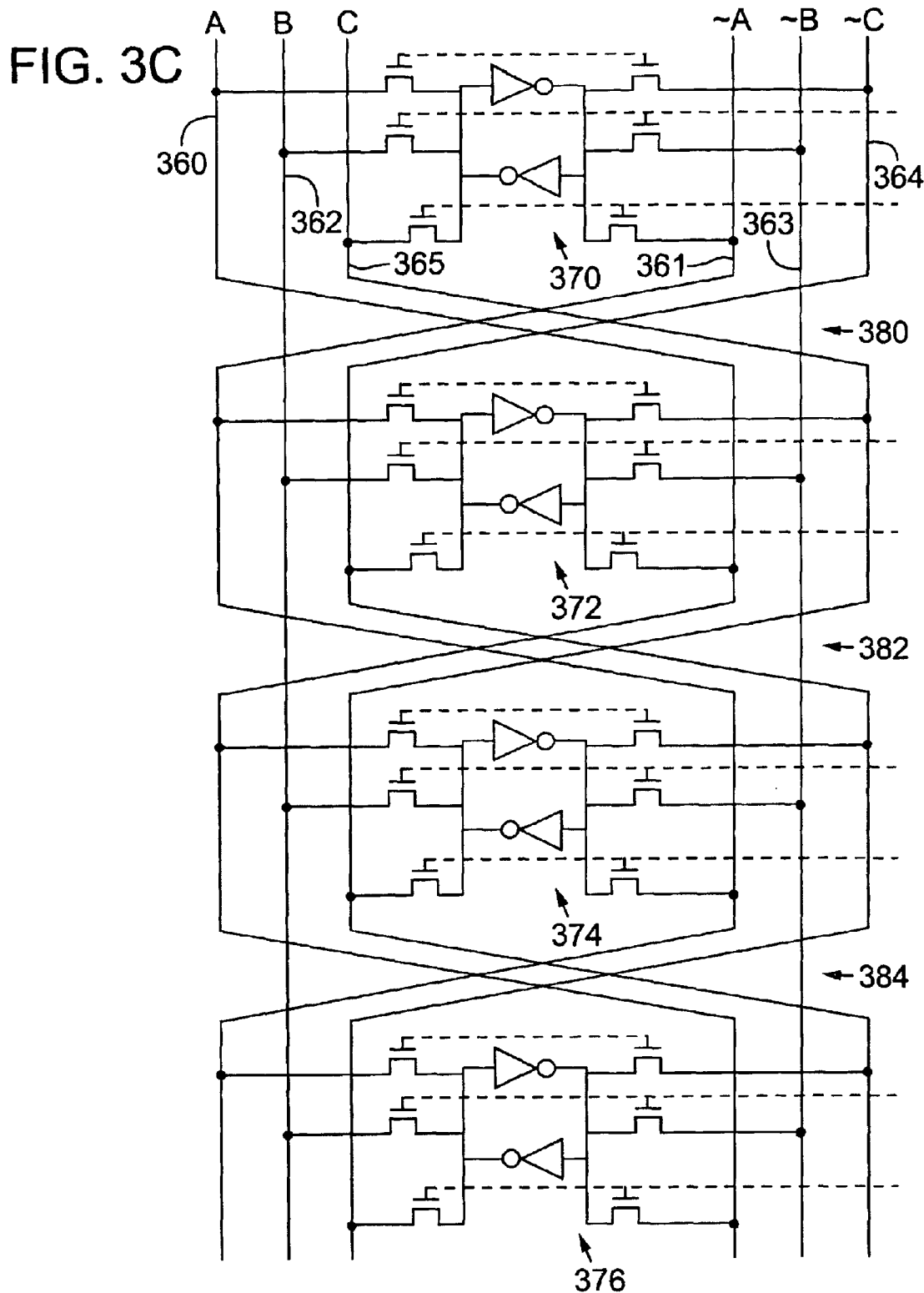
FIG. 3C is a schematic diagram of a column of a 3-port memory using the memory cell of FIG. 3B.

A representative column of a 3-port memory such as the memory 300 using 10-transistor bitcells shown in FIG. 3B is illustrated in FIG. 3C. A- and ~A-bitlines 360, 361, B and ~B-bitlines 362, 363, and C-and ~C-bitlines 364, 365 are configured to drive bitcells 370, 372, 374, 376. A- and ~A-bitlines 360, 361 and C- and ~C-bitlines 363, 364 exchange in bitline regions 380, 384, and B- and ~B-bitlines exchange in an exchange region 382. In the example of FIG. 3B, bitline exchanges are associated with crossovers of two bitlines, so that all bitline exchanges can be provided in two conductor layers. Bitlines can also be arranged in different orders. For example, A- and ~A-complement bitlines can be adjacent as in the example of FIG. 1A.

Representative examples of multi-port memories that include bitline exchanges and memory array drivers configured to read and write memory cells in such memories have been described. In other examples, 2,3, 4 or more port memories can be associated with bitline exchanges associated with some or all memory ports. Bitline exchanges for such memories can be defined in two or more conductor layers, and bitline exchanges can be located at or near bitcells or located between rows or columns of bitcells. In the illustrated examples, all memory cells used in a memory are of the same configuration, but in other examples, different memory cell configurations can be used in one or more memory locations, or different memory cell configurations can be used in one or more rows and/or columns.

Bitcell arrays can also be based on a common memory cell column. For example, a memory can be based on one or more columns of bitcells such as the column shown in FIG. 3B. In some examples, memory cell columns include memory cells of a common design. In some examples, memory cell columns are situated between one or more conductors that are at a fixed voltage. Bitline drivers for bitlines of several or all columns can be of a common design, or different bitcell drivers can be used. Memory arrays can also be based on bitcell rows.

It will be apparent that these examples can be modified in arrangement and detail, and we claim all that is encompassed by the appended claims;

We claim:

1. A memory array, comprising:
   at least a first column of memory cells and a second column of memory cells, wherein the memory cells of the first column and the second column have a common logic and are associated with at least a first memory port and a second memory port;
   first column bitlines in communication with the memory cells of the first column, the first column bitlines including bitlines in communication with the first memory port and the second memory port, wherein the bitlines associated with the fist memory port include a bitline exchange associated with a first selected row of memory cells and the bitlines associated with the second memory port include a bitline exchange associated with a second selected row of memory cells, wherein the first selected row and the second selected row are different; and second column bitlines in communication with the memory cells of the second column, the second column bitlines including bitlines in communication with the first memory port and the second memory port, wherein the bitlines associated with the first memory port include a bitline exchange associated with the first selected row of memory cells and the bitlines associated with the second memory port include a bitline exchange associated with the second selected row of memory cells.

2. The memory array of claim 1, further comprising a conductor situated between the first column of memory cells and the second column of memory cells and configured to be charged to a predetermined voltage.

3. The memory array of claim 1, wherein the conductor is configured to supply electrical power to the memory cells of at least one of the first column and the second column of memory cells.

4. The memory array of claim 1, wherein the memory cells of the first column and the second column have a common design.

5. The memory array of claim 1, wherein the memory cells are associated with a third memory port, and bitlines associated with the third memory port include bitline exchanges at one of the first selected row or the second selected row.

6. A memory, comprising:
   an array of multi-port memory cells, the array associated with a plurality of columns of memory cells;
   a plurality of bitlines in communication with the columns of memory cells, wherein the plurality of bitlines for each column of memory cells includes bitlines associated with the memory ports of the multi-port memory cells, wherein the bitlines associated with at least a first memory port include a bitline exchange associated with a first selected row of memory cells and the bitlines associated with at least a second memory port include a bitline exchange associated with a second selected row of memory cells, wherein the first selected row and the second selected row are different.

7. The memory of claim 6, further comprising a set of intercolumn conductors configured to be charged to at least one fixed voltage.

8. The memory of claim 7, wherein the set of intercolumn conductors includes conductors associated with a fist voltage and a second voltage.

9. The memory of claim 7, wherein the bitlines and bitline exchanges associated with a selected memory port are defined in two conductor layers.

10. The memory of claim 6, wherein each of the columns of memory cells is of a common design.

11. The memory of claim 6, wherein each of the memory cells is of a common design.

12. A method of designing a multi-port memory array, comprising:
    defining a column of memory cells having bitlines associated with each of the memory ports;
    associating bitline exchanges with the bitlines of at least two memory ports, wherein the bitline exchanges for the at least two memory ports are associated with different rows; and
    arranging plurality of the columns of memory cells to form an array of memory cells, thereby forming a multi-port memory array.

13. A computer readable medium comprising computer executable instructions for performing the method of claim 12.

14. The method of claim 12, further comprising defining the bitlines and bitline exchanges in two conductor layers.

15. A method of reducing electrical interference in a multi-port memory, comprising:
    interchanging complementary bitlines associated with a first memory port at least a first row in substantially all columns of the memory; and
    interchanging complementary bitlines associated with a second memory port at at least a second row in substantially all columns of the memory, wherein the second row is different than the first row.

16. The method of claim 15, wherein the complementary bitlines associated with the first memory port are interchanged at a first set of rows and the complementary bitlines associated with the second memory port are interchanged at a second set of rows, wherein the first set of rows and the second set of rows are different.

17. The method of claim 16, wherein the first set of rows includes even-numbered rows and the second set of rows includes odd-numbered rows.

* * * * *

UNITED STATES PATENT AND TRADEMARK OFFICE
CERTIFICATE OF CORRECTION

PATENT NO.   : 6,909,663 B1
DATED        : June 21, 2005
INVENTOR(S)  : Hemanshu Vernenker et al.

It is certified that error appears in the above-identified patent and that said Letters Patent is hereby corrected as shown below:

Column 6,
Line 63, "fist" should be -- first --.

Column 8,
Line 2, "fist" should be -- first --.
Line 30, "first memory port at least a first row" should be -- first memory port at at least a first row --.

Signed and Sealed this

Twenty-seventh Day of September, 2005

JON W. DUDAS
*Director of the United States Patent and Trademark Office*